(12) United States Patent
Mastromatteo

(10) Patent No.: US 8,050,011 B2
(45) Date of Patent: Nov. 1, 2011

(54) PROCESS FOR SEALING AND CONNECTING PARTS OF ELECTROMECHANICAL, FLUID AND OPTICAL MICROSYSTEMS AND DEVICE OBTAINED THEREBY

(75) Inventor: Ubaldo Mastromatteo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 142 days.

(21) Appl. No.: 12/417,461

(22) Filed: Apr. 2, 2009

(65) Prior Publication Data

US 2009/0186447 A1    Jul. 23, 2009

Related U.S. Application Data

(62) Division of application No. 10/060,068, filed on Jan. 29, 2002, now Pat. No. 7,531,897.

(30) Foreign Application Priority Data

Jan. 30, 2001    (IT) .................................. TO01A0086

(51) Int. Cl.
*H01L 21/00* (2006.01)
*H01G 4/00* (2006.01)
(52) U.S. Cl. ........................................ 361/290; 438/107
(58) Field of Classification Search .................. 438/107; 361/290
See application file for complete search history.

(56) References Cited

U.S. PATENT DOCUMENTS

| | | | |
|---|---|---|---|
| 4,784,970 A | 11/1988 | Solomon | |
| 5,236,118 A | 8/1993 | Bower et al. | |
| 5,343,064 A | 8/1994 | Spangler et al. | |
| 5,561,248 A | 10/1996 | Negoro | |
| 5,633,535 A | 5/1997 | Chao et al. | |
| 5,726,500 A | 3/1998 | Duboz et al. | |
| 6,137,164 A | 10/2000 | Yew et al. | |
| 6,238,946 B1 | 5/2001 | Ziegler | |
| 6,291,875 B1 | 9/2001 | Clark et al. | |
| 6,465,271 B1 * | 10/2002 | Ko et al. | 438/48 |
| 6,570,221 B1 | 5/2003 | Allman | |
| 6,730,534 B2 | 5/2004 | Arima | |
| 6,759,332 B2 | 7/2004 | Clevenger et al. | |
| 6,887,769 B2 | 5/2005 | Kellar et al. | |

* cited by examiner

*Primary Examiner* — Long Pham
*Assistant Examiner* — Steven Rao
(74) *Attorney, Agent, or Firm* — Lisa K. Jorgenson; Robert Iannucci; Seed IP Law Group PLLC

(57) ABSTRACT

A process for connecting two bodies forming parts of an electromechanical, fluid and optical microsystem, wherein a welding region is formed on a first body; an electrically conductive region and a spacing region are formed on a second body; the spacing region extends near the electrically conductive region and has a height smaller than the electrically conductive region. One of the first and second bodies is turned upside down on the other, and the two bodies are welded together by causing the electrically conductive region to melt so that it adheres to the welding region and collapses until its height becomes equal to that of the spacing region. Thereby it is possible to seal active parts or micromechanical structures with respect to the outside world, self-align the two bodies during bonding, obtain an electrical connection between the two bodies, and optically align two optical structures formed on the two bodies.

26 Claims, 4 Drawing Sheets

US 8,050,011 B2

PROCESS FOR SEALING AND CONNECTING PARTS OF ELECTROMECHANICAL, FLUID AND OPTICAL MICROSYSTEMS AND DEVICE OBTAINED THEREBY

CROSS-REFERENCE TO RELATED APPLICATION

This application is a divisional of U.S. patent application Ser. No. 10/060,068, filed Jan. 29, 2002, now pending, which application is incorporated herein by reference in its entirety.

BACKGROUND OF THE INVENTION

1. Field of the Invention

The present invention relates to a process for sealing and connecting parts of electromechanical, fluid and optical systems and to a device obtained thereby.

2. Description of the Related Art

Various solutions are known for connecting together devices formed in different chips. A known solution, referred to as "flip chip", envisages connection of two or more chips, mounted on a same printed-circuit board, via connections formed by the same printed circuit. In another solution, referred to as "chip-to-chip wire bonding", two or more chips are electrically connected though free wires that extend between pairs of chips.

In yet another solution, referred to as "chip-on-chip wire bonding", a first chip is mounted on a second chip, generally of larger dimensions, and the two chips are connected together by means of free wires.

On the other hand, the need is increasingly felt of a process of welding and sealing parts of a same microsystem, given that the increase in the complexity of the systems imposes the need to form the individual parts of the same device in different wafers.

BRIEF SUMMARY OF THE INVENTION

An embodiment of the present invention provides a process enabling connection and sealing of parts of a device formed on different wafers.

According to an embodiment of the present invention, a process is provided for connecting two bodies forming parts of an electromechanical, fluid and optical microsystem, including forming an electrically conductive region having a first height on a first body, forming a spacing region near said electrically conductive region on said first body, said spacing region having a second height, smaller than said first height forming a welding region on a second body, turning one between said first and second bodies upside down on top of the other, welding said electrically conductive region to said welding region by causing said electrically conductive region to reflow and collapse in such a way that said first height becomes equal to said second height.

Moreover, according to an embodiment of the invention, there is provided a device forming an electromechanical, fluid and optical microsystem including at least one first body and at least one second body welded together by a mechanical and electrical connection structure, wherein said mechanical and electrical connection structure comprises an electrically conductive region welded between said two bodies and a spacing region arranged near said electrically conductive region and surrounding an active region of said electromechanical microsystem.

BRIEF DESCRIPTION OF THE SEVERAL VIEWS OF THE DRAWING(S)

For a better understanding of the present invention, preferred embodiments thereof are now described, purely by way of non-limiting example with reference to the attached drawings, wherein.

DETAILED DESCRIPTION OF THE INVENTION

Figure 1:
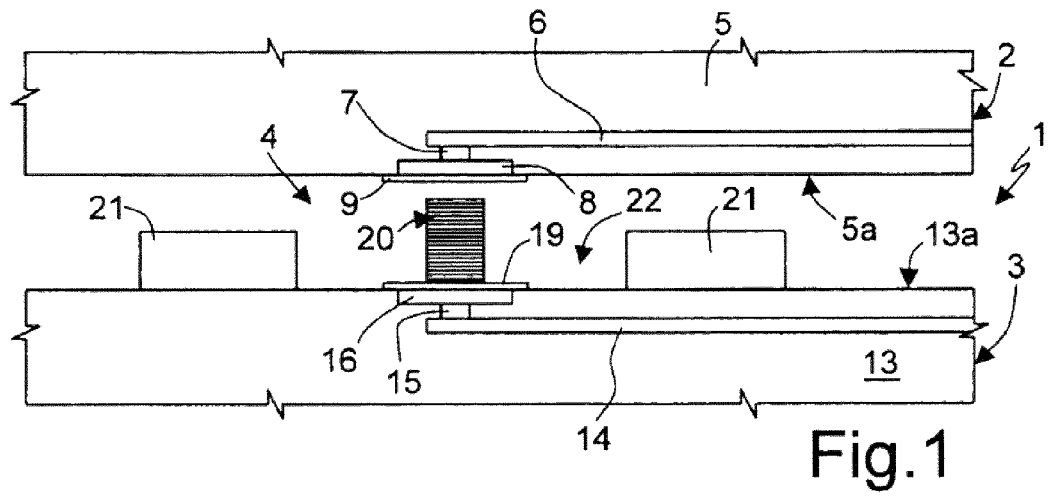
FIG. 1 shows a cross-section of a device formed on two wafers before the latter are bonded together using the process according to the invention.

FIG. 1 shows a detail of a device 1 forming an integrated electromechanical microsystem having two parts, namely a first part formed in a first wafer 2 and a second part formed in a second wafer 3. Of the two wafers 2, 3 only one portion is shown, wherein a mechanical and electrical connection structure 4 according to an embodiment of the invention is formed.

In detail, the first wafer 2 comprises a first insulating layer 5 having a surface 5a and housing a first connection line 6 connected to the surface 5a of the first insulating layer 5 through a first via 7 and a first contact pad 8. A first metal region 9 extends on top of the surface 5a of the first insulating layer 5, overlies and is in direct electrical contact with the first contact pad 8.

The second wafer 3 comprises a second insulating layer 13 having a surface 13a and housing a second connection line 14 connected to the surface 13a of the second insulating layer 13 through a second via 15 and a second contact pad 16. A second metal region 19 extends on top of the surface 13a of the second insulating layer 13, overlies and is in direct electrical contact with the second contact pad 16.

In addition, a plug region 20 and spacing regions 21 extend on top of the surface 13a of the second insulating layer 13. In detail, the plug region 20 is formed on top of and in direct electrical contact with the second metal region 19 and has a greater height than that of the spacing regions 21. The plug region 20 has the purpose of electrically connecting the first metal region 9 and the second metal region 19 and must reflow when bonding the two wafers 2, 3. For this purpose, the material of the plug region 20 must be able to reflow at a sufficiently low temperature and in an inert atmosphere, whether a reducing atmosphere or a vacuum. For example, the material of the plug region 20 is a low-melting eutectic formed by alternating layers (typically of gold and tin) for a total height of, for instance, 10 μm.

The spacing regions 21 have the function of maintaining the wafers 2, 3 at a distance after bonding, sealing any active or micromechanical parts that may be present, and confining the plug region 20. To this end, the spacing regions 21 are preferably made of a dielectric material with characteristics such as to be able to withstand the bonding temperature, be perfectly planar, and form an electrical insulator so as to be able to pass through possible metal regions without creating short circuits. For example, the spacing regions 21 may be of spun polymers, such as the material known as SU8 (Shell Upon 8), produced by SOTEC MICROSYSTEMS, or polyimide, of laminated polymer layers, such as photosensitive stick foils, for instance Riston, or else oxynitride layers deposited at low temperatures.

Figure 2:
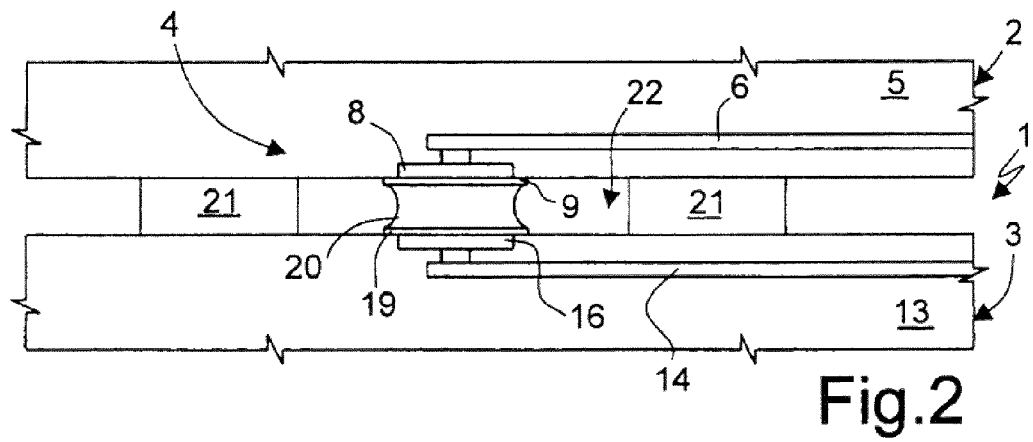
FIG. 2 shows the device of FIG. 1 after bonding.

The spacing regions 21 may form part of a single region having an opening that forms a delimiting cavity 22 in an area corresponding to the plug region 20, or else be two distinct adjacent regions that delimit, between them, the delimiting cavity 22. In either case, the volume of the delimiting cavity 22 must be greater than that of the plug region 20 so as to enable collapse of the plug region 20 during bonding in such a way that the adhesion forces of the eutectic to the metal regions 9, 19 and the cohesion forces of the eutectic will guarantee stable sealing of the delimiting cavity 22, as shown in FIG. 2.

The two wafers 2, 3 are manufactured in a known way, according to the devices that are to be made. In particular, on both of the surfaces 5a and 13a of the insulating layers 5 and 13, metal regions 9, 19, for example of titanium, nickel or gold, are formed. Next, by appropriate deposition and masking steps per se known, first the spacing regions 21 and then the plug region 20 are formed on one of the two wafers, whichever is the more convenient from the point of view of the process (in the example shown in FIG. 1, the second wafer 3).

Bonding then takes place by bringing the two wafers 2, 3 up to one another and applying a slight pressure at a low temperature (for example, 200° C.) so as to cause a weak bonding of the plug region 20, which adheres to the first metal region 9 just enough to immobilize the two parts. By then increasing the temperature up to the reflow temperature of the material of the plug region 20 (for example, up to 300° C.), the latter region is made to collapse. Consequently, the surface 5a of the first insulating layer 5 belonging to the first wafer 2 is brought into contact with the spacing regions 21, the height of which thus determines the spacing between the two wafers 2, 3, as shown in FIG. 2.

At the end of the process, the first connection region 6 is electrically connected to the second connection region 14, and the plug region 20 is confined within the delimiting cavity 22. Consequently, the plug region 20 and the spacing regions 21 form the mechanical and electrical connection structure 4.

Figure 3:
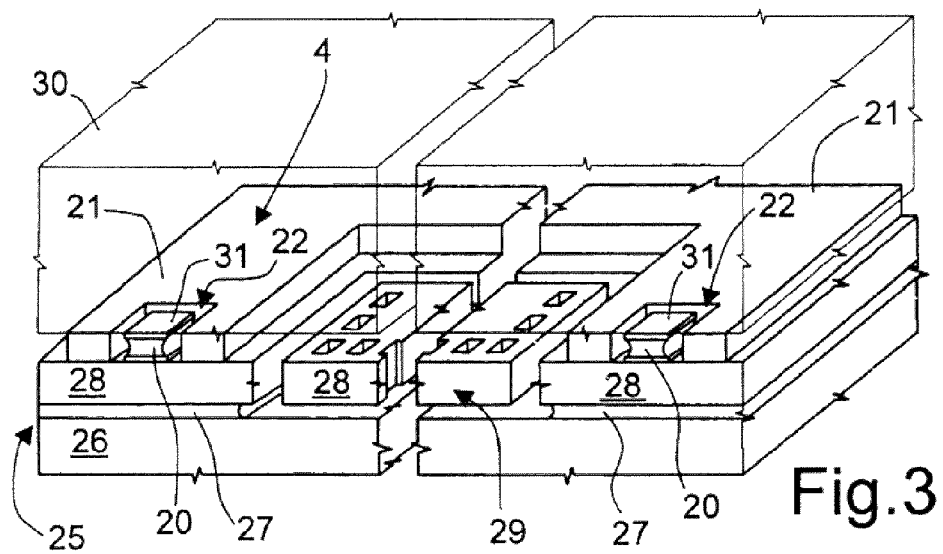
FIG. 3 is a perspective and sectional view of the device of FIG. 3.
Figure 3A:
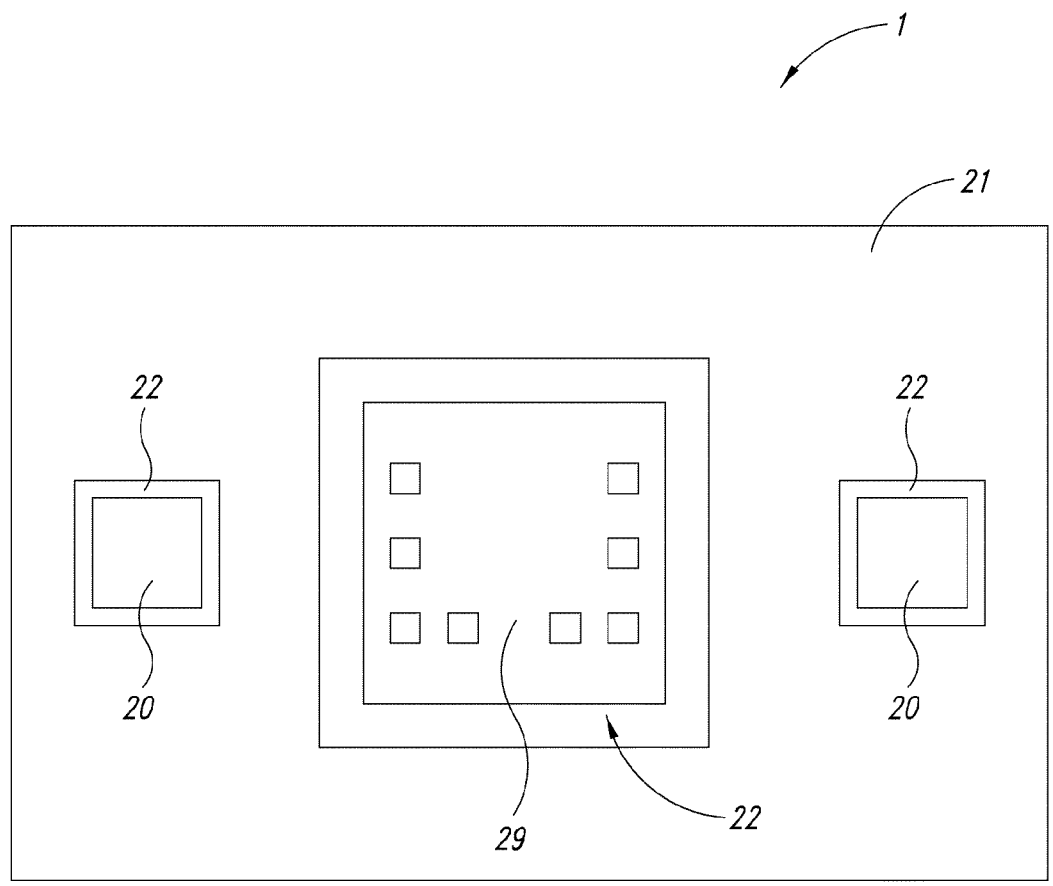
FIG. 3A is a top plan view of the device of FIG. 3.

Thanks to the mechanical and electrical connection structure 4 described above, it is possible to seal, with respect to the outside world, an active part of an electronic device and/or a micromechanical structure, as shown in FIG. 3. In FIG. 3, a first wafer 25 comprises a substrate 26 of semiconductor material, for example silicon, partially overlaid by a silicon-dioxide layer 27, which is removed in a central portion. The silicon-dioxide layer 27 is in turn overlaid by an epitaxial layer 28, the central portion of which defines a microstructure 29 which is suspended through arms (not shown). In the peripheral area, on top of an insulating layer (not shown), in which connection lines (not shown either) are formed, a spacing region 21 is present which completely surrounds the microstructure 29 (as is shown only for one half of the device, the other half being symmetrical to the half shown in FIG. 3). The spacing region 21 moreover forms two delimiting cavities 22, inside which two plug regions 20 are present. A second wafer 30 (shown in a ghost view) extends on top of the first wafer 25, in contact with the spacing region 21 and the plug regions 20. In particular, the second wafer 30 comprises metal regions 31 that extend on top of and in direct electrical contact with the plug regions 20, and electrical connection regions (not shown either) connected to the metal regions.

By appropriately configuring the plug region 20 so that it completely surrounds active or micromechanical parts, it is possible to ensure perfect sealing (even vacuum sealing or sealing in a controlled environment) of these parts.

Figure 4:
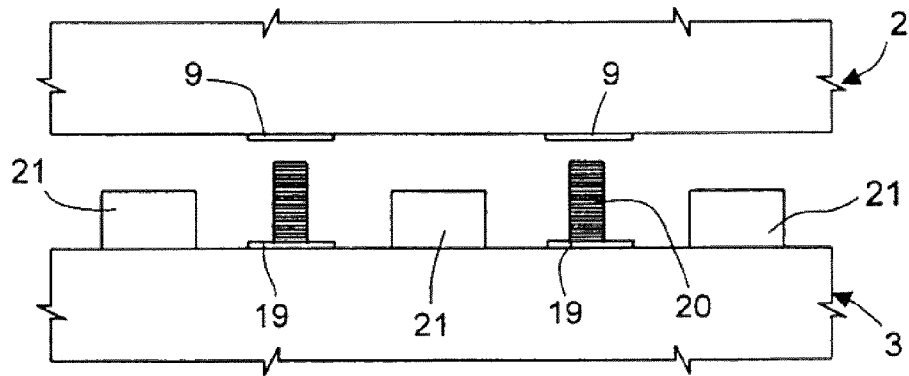
FIG. 4 shows a cross-section of a connection structure according to the invention during self-alignment of two parts.
Figure 5:
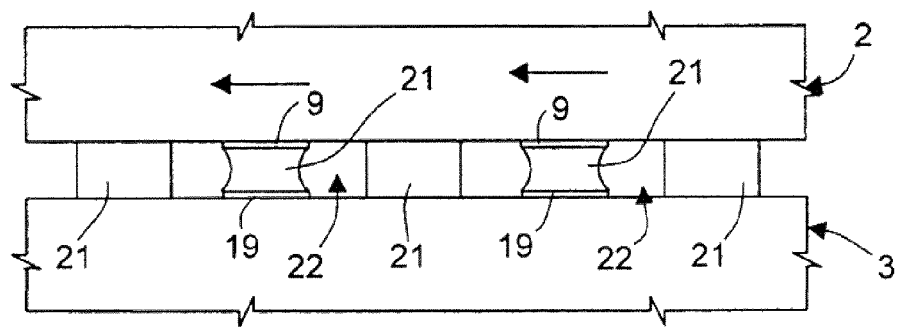
FIG. 5 shows the cross-section of FIG. 4, after bonding the two parts.

The mechanical and electrical connection structure 4 described above enables self-alignment between the two wafers during bonding, as is shown in FIGS. 4 and 5. In fact, when the eutectic is melted, it is liquid. In this condition, on the one hand adhesion forces are generated between the eutectic material of the plug regions 20 and the respective first metal regions 9, and, on the other hand, the surface tension of the liquid tends to bring it to a condition of minimum volume. The combination of these two characteristics cause the eutectic material to behave like a spring, drawing the metal regions 9 and 19 as close together as possible and, in the process, aligning them vertically. If one of the two wafers 2, 3 is displaced laterally with respect to the other, as shown by the arrow in FIG. 5, the plug regions 20 automatically tend to assume a roughly paralellepipedal shape (or a cylindrical shape if the first metal regions 9 and the second metal regions 19 are circular) with a vertical axis, namely, with the metal regions 9, 19 aligned with respect to one another.

Figure 6:
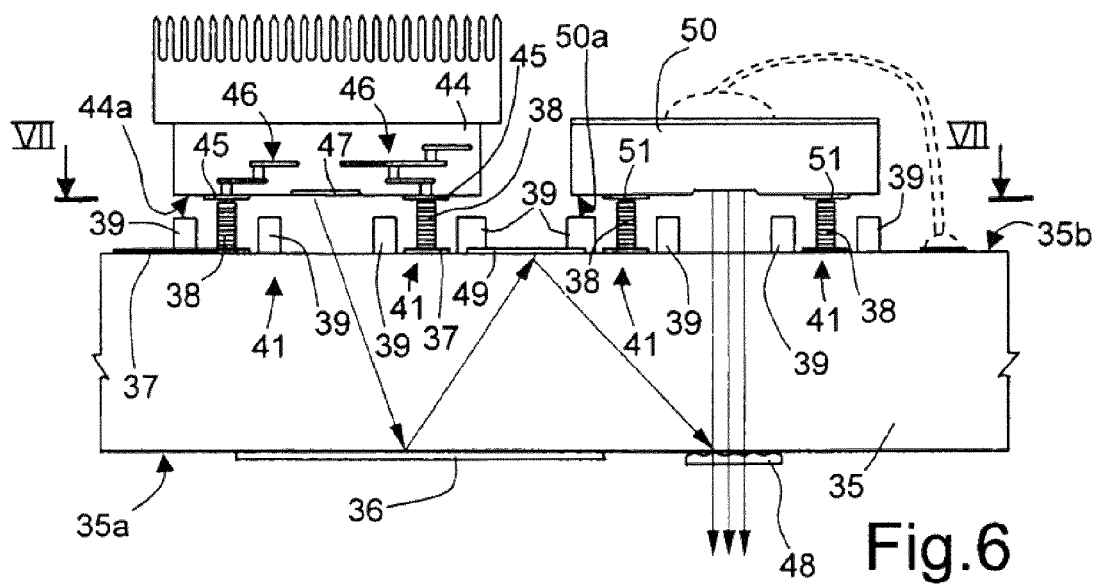
FIG. 6 shows a cross-section of an optical device formed in two wafers bonded using the process according to the invention.
Figure 7:
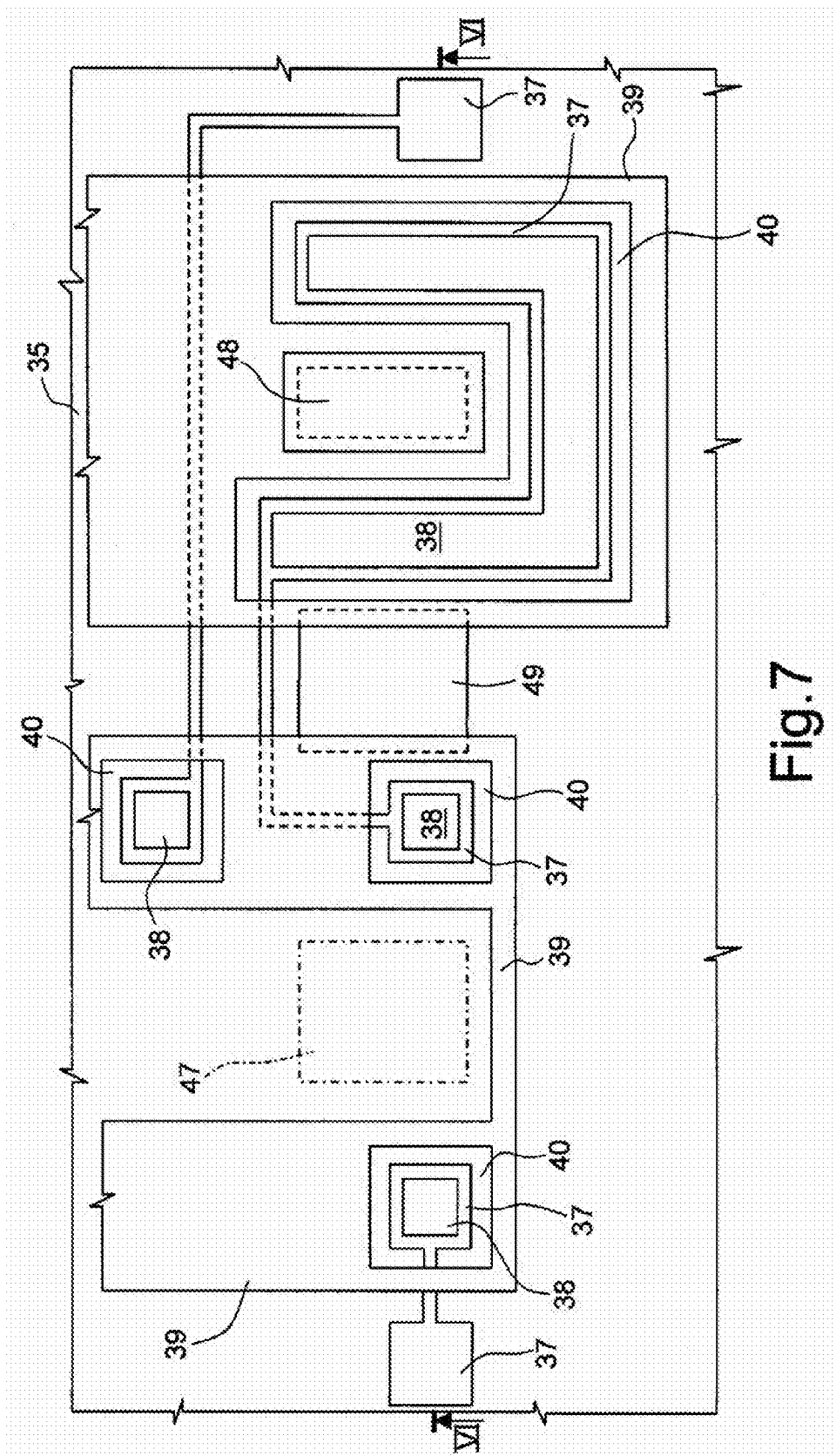
FIG. 7 is a top plan view of one of the two wafers of FIG. 6.

With the present mechanical and electrical connection structure 4 as described above it is possible to obtain optical alignment between the various parts in case of optical devices (the so-called MOEMS, i.e., MicroOpticalElectro-Mechanical Systems), as shown in FIGS. 6 and 7.

In detail, FIGS. 6 and 7 show an optical module formed by a first body 35 of glass (quartz) carrying, on a bottom surface 35a, a mirror 36 and a diffractive lens 48, and, on a top surface 35b, a plurality of mechanical and electrical connection structures 41 according to an embodiment of the invention. Each mechanical and electrical connection structure 41 comprises, analogously to the above, a plug region 38 that extends in a delimiting cavity 40 formed by spacing regions 39. In the example illustrated, first metal regions 37 are formed on the top surface 35b of the first body 35 and extend laterally starting from respective plug regions 38, passing underneath the spacing regions 39 which surround them as far as accessible external areas so as to connect electrically each plug region 38 to the outside. A metal region 49 is formed on the top surface 35b of the first body 35 and is of the same material as the metal regions 37 and functioning as an alignment mirror.

A second body 44, of smaller dimensions than the first body 35 and of silicon/germanium, carries, on its bottom surface 44a, second metal regions 45 that are to be bonded to as many plug regions 38 and are electrically connected to electrical connection regions 46. In addition, a light-emitting diode 47, made in a known way, is formed on the bottom surface 44a of the second body 44.

A third body 50, of smaller dimensions than the first body 35 and of semiconductor material, forms an optical component and carries, on its bottom surface 50a, a third metal region 51, which is U-shaped and is to be bonded to a plug region 38 having a corresponding shape (see FIG. 7).

The second body 44 must be bonded in such a way as to be vertically aligned to the mirror 36; the third body 50 must be bonded in such a way as to be vertically aligned to the diffractive lens 48.

Bonding of the second body 44 and the third body 50 is performed as described previously.

With the mechanical and electrical connection structure according to an embodiment of the invention it is therefore possible to connect together two wafers or a wafer and a chip, ensuring sealing of the active or micromechanical part with respect to the outside environment. In addition, the mechanical and electrical connection structure according to the present embodiment of the invention enables self-alignment between the two parts to be connected together, as explained previously; it also enables electrical connection between the two parts and, in the case of optical structures, it enables optical alignment to be achieved.

Finally, it is clear that modifications and variations may be made to the process and device described and illustrated herein, without thereby departing from the scope of the present invention. In particular, it is emphasized that the process and device enable even just mechanical connection between two parts, should it be necessary to connect the two parts also in points in which electrical connections are not required. In this case, the metal regions on which the corresponding plug regions are formed or to which they are bonded may be electrically floating. Alternatively, electrical connection to the metal regions may be obtained through interconnection regions formed inside or on top of the two parts, according to the requirements and materials of these parts. Insulation of the plug regions within closed delimiting cavities is not indispensable provided that there is no risk of contamination of the eutectic material of the plug regions.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A process for forming a microsystem, comprising:
   forming, on a first body, a first electrically conductive region;
   forming, on a second body, a second electrically conductive region having a first height;
   forming, on said second body, a spacing region, near said second electrically conductive region, said spacing region having a second height, smaller than said first height; and
   welding said first and second electrically conductive regions to each other by causing said second electrically conductive region to reflow and collapse so that said first height becomes equal to said second height.

2. The process according to claim 1, wherein said second electrically conductive region is of a low-melting eutectic material.

3. The process according to claim 2, wherein said low-melting eutectic material is formed by alternating layers of gold and tin.

4. The process according to claim 1, wherein said spacing region is of dielectric material.

5. The process according to claim 4, wherein said dielectric material is chosen from among a spun polymer, polyimide, a composite material formed by laminated polymer layers, and oxynitrides.

6. The process according to claim 1, wherein said forming the pacing region comprises forming, in said spacing region, a delimiting cavity surrounding said second electrically conductive region and having a greater volume than said second electrically conductive region.

7. The process according to claim 1, wherein said spacing region surrounds an active region of an electromechanical microsystem.

8. The process according to claim 1, further comprising forming a metal region between said second body and said second electrically conductive region.

9. The process according to claim 8, wherein said first electrically conductive region and said metal region are of a material chosen from among titanium, gold and nickel.

10. The process according to claim 1, wherein said welding said first and second electrically conductive regions is carried out at a temperature of between 200 and 300° C.

11. The process according to claim 1, further comprising forming first electrical interconnection regions in electrical contact with said second electrically conductive region and inside said second body.

12. The process according to claim 11, further comprising forming second electrical interconnection regions in electrical contact with said first electrically conductive region and inside said first body.

13. A method forming an electromechanical or optical microsystem, comprising:
   forming a first body and a second body;
   forming, on the first body, a first electrically conductive region;
   forming, on the second body, a second electrically conductive region having a first height;
   forming, between said first and second bodies, a spacer, near said second electrically conductive region, said spacer having a second height, smaller than said first height; and
   welding together the first and second bodies, the spacer having at least three sides defining a first cavity surrounding an active region of said electromechanical or optical microsystem, the welding including welding the second electrically conductive region to the first electrically conductive region and changing the height of the second electrically conductive region from the second height to the first height.

14. The method according to claim 13, wherein said second electrically conductive region is of a low-melting eutectic material.

15. The method according to claim 14, wherein said low-melting eutectic material is formed by alternating layers of gold and tin.

16. The method according to claim 13, wherein said spacer is of dielectric material.

17. The method according to claim 13, further comprising attaching the second electrically conductive region and the spacer to the second body before welding the second electrically conductive region to the first body.

18. The method of claim 13, wherein welding the second electrically conductive region to the first body includes:
   contacting the first body and the electrically conductive region with a pressure and at a first temperature; and
   reflowing the second electrically conductive region by applying a second temperature, higher than the first temperature, to the second electrically conductive region; thereby enabling the first body to contact the spacer.

19. The method according to claim 13, wherein said spacer also forms a completely enclosed second cavity surrounding said second electrically conductive region.

20. The method according to claim 13, further comprising forming a metal region on top of said second body and beneath said second electrically conductive region.

21. A method, comprising:
   forming, on a first surface of a first body of semiconductor material, a first metal region;
   forming, on a first surface of a second body of semiconductor material, a second metal region;
   forming, on the first metal region, a welding region having a first height;

forming, on the first surface of the first or second body, a spacer having a second height, shorter than the first height;

positioning the first and second bodies such that their respective first surfaces face each other, with the first and second metal regions opposite each other; and causing the welding region to reflow and bond with the second metal region, such that the first height becomes equal to the second height, and such that an electrical connection is formed between the first and second metal regions.

22. The method of claim 21 wherein the spacer is of dielectric material.

23. The method of claim 21 wherein the spacer defines a cavity within which is formed the first or second metal region.

24. The method of claim 21 wherein the spacer forms a cavity within which is formed a micro-mechanical structure.

25. The method of claim 21, further including the step of forming, in the first body, an electrical trace in electrical contact with the first metal region.

26. The method of claim 21, further including the step of forming, in the second body, an electrical trace in electrical contact with the second metal region.

* * * * *